(12) United States Patent
Choi

(10) Patent No.: US 9,941,289 B2
(45) Date of Patent: Apr. 10, 2018

(54) ANTI-FUSE TYPE NONVOLATILE MEMORY CELLS, ARRAYS THEREOF, AND METHODS OF OPERATING THE SAME

(71) Applicant: SK hynix Inc., Gyeonggi-do (KR)

(72) Inventor: Kwang Il Choi, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/173,267

(22) Filed: Jun. 3, 2016

(65) Prior Publication Data
US 2017/0186756 A1   Jun. 29, 2017

(30) Foreign Application Priority Data
Dec. 23, 2015   (KR) .................. 10-2015-0184557

(51) Int. Cl.
| H01L 27/112 | (2006.01) |
| H01L 27/115 | (2017.01) |
| G11C 17/16 | (2006.01) |
| G11C 17/18 | (2006.01) |
| H01L 27/11582 | (2017.01) |

(52) U.S. Cl.
CPC ........ H01L 27/11206 (2013.01); G11C 17/16 (2013.01); G11C 17/18 (2013.01); H01L 27/11582 (2013.01)

(58) Field of Classification Search
CPC ............. H01L 27/112; H01L 27/11206; H01L 27/115; H01L 27/11582
See application file for complete search history.

(56) References Cited

U.S. PATENT DOCUMENTS

| 8,592,942 | B2 | 11/2013 | Kodama et al. | |
| 2006/0046354 | A1* | 3/2006 | Kreipl | H01L 27/112 438/132 |
| 2012/0153404 | A1* | 6/2012 | Ahn | H01L 23/5252 257/402 |
| 2012/0292682 | A1* | 11/2012 | Pan | H01L 29/66825 257/315 |
| 2014/0054712 | A1* | 2/2014 | Jung | H01L 27/088 257/368 |
| 2014/0124864 | A1* | 5/2014 | Hong | H01L 21/02532 257/355 |
| 2014/0138777 | A1* | 5/2014 | Wang | G11C 17/16 257/379 |
| 2014/0183689 | A1* | 7/2014 | Sung | H01L 27/11206 257/530 |
| 2016/0293612 | A1* | 10/2016 | Park | H01L 21/823437 |

* cited by examiner

Primary Examiner — Fazli Erdem
(74) Attorney, Agent, or Firm — IP & T Group LLP

(57) ABSTRACT

An anti-fuse type nonvolatile memory cell includes a semiconductor layer having a first conductivity type, a junction region having a second conductivity type and a trench isolation layer disposed in an upper portion of the semiconductor layer spaced apart from each other by a channel region, an anti-fuse insulation pattern disposed on the channel region, a gate electrode disposed on the anti-fuse insulation pattern, a gate spacer disposed on sidewalls of the anti-fuse insulation pattern and the gate electrode, a word line connected to the gate electrode, and a bit line connected to the junction region. The anti-fuse insulation pattern is broken if a first bias voltage and a second bias voltage are applied to the word line and the bit line, respectively.

7 Claims, 14 Drawing Sheets

ANTI-FUSE TYPE NONVOLATILE MEMORY CELLS, ARRAYS THEREOF, AND METHODS OF OPERATING THE SAME

CROSS-REFERENCE TO RELATED APPLICATIONS

The present application claims priority under 35 U.S.C 119(a) to Korean Patent Application No. 10-2015-0184557 filed on Dec. 23, 2015, which is herein incorporated by references in its entirety.

BACKGROUND

1. Technical Field

Various embodiments of the present disclosure relate to nonvolatile memory devices and, more particularly, to anti-fuse type nonvolatile memory cells, arrays thereof, and methods of operating the same.

2. Related Art

Nonvolatile memory devices retain their stored data even when their power supplies are interrupted. Such nonvolatile memory devices may include read only memory (ROM) devices, one time programmable (OTP) memory devices and rewritable memory devices. Generally, the nonvolatile memory devices have been realized by using a complementary metal-oxide-semiconductor (CMOS) compatible process.

The OTP memory devices may be categorized as either fuse type OTP memory devices or anti-fuse type OTP memory devices. Each of memory cells included in the fuse type OTP memory devices may provide a short circuit before it is programmed and may provide an open circuit after it is programmed. In contrast, each of memory cells included in the anti-fuse type OTP memory devices may provide an open circuit before it is programmed and may provide a short circuit after it is programmed. In consideration of characteristics of the MOS transistors, the CMOS processes may be suitable for fabrication of the anti-fuse type OTP memory devices.

SUMMARY

Various embodiments are directed to anti-fuse type nonvolatile memory cells, arrays thereof, and methods of operating the same.

According to an embodiment, an anti-fuse type nonvolatile memory cell includes a semiconductor layer having a first conductivity type, a junction region having a second conductivity type and a trench isolation layer disposed in an upper portion of the semiconductor layer spaced apart from each other by a channel region, an anti-fuse insulation pattern disposed on the channel region, a gate electrode disposed on the anti-fuse insulation pattern, a gate spacer disposed on sidewalls of the anti-fuse insulation pattern and the gate electrode, a word line connected to the gate electrode, and a bit line connected to the junction region. The anti-fuse insulation pattern is broken if a first bias voltage and a second bias voltage are applied to the word line and the bit line, respectively.

According to another embodiment, an anti-fuse type nonvolatile memory cell includes a semiconductor layer having a first conductivity type, a first junction region having a second conductivity type and a second junction region having the second conductivity type disposed in an upper portion of the semiconductor layer spaced apart from each other by a channel region, an anti-fuse insulation pattern disposed on the channel region, a gate electrode disposed on the anti-fuse insulation pattern, a gate spacer disposed on sidewalls of the anti-fuse insulation pattern and the gate electrode, a word line connected to the gate electrode, and a bit line connected to the first junction region. The anti-fuse insulation pattern is broken by a first bias voltage and a second bias voltage respectively applied to the word line and the bit line, while the second junction region is floated.

According to another embodiment, there is provided an anti-fuse type nonvolatile memory (NVM) cell array. The anti-fuse type NVM cell array includes a plurality of active regions defined in a well region of a first conductivity type, extending in a first direction, and spaced apart from each other in a second direction intersecting the first direction. First junction regions of a second conductivity type and second junction regions of the second conductivity type are alternatively disposed in each of the plurality of active regions in the first direction. A plurality of gate electrodes extend in the second direction and spaced apart from each other in the first direction. Each of the plurality of gate electrodes intersects the plurality of active regions. A plurality of gate spacers are disposed on sidewalls of the plurality of gate electrodes, respectively. A plurality of word lines are connected to the plurality of gate electrodes, respectively. A plurality of bit lines are connected to the first junction regions. Each of the plurality of bit lines is connected to the first junction regions disposed in any one of the plurality of active regions.

According to another embodiment, there is provided an anti-fuse type nonvolatile memory (NVM) cell array. The anti-fuse type NVM cell array includes a plurality of word lines respectively disposed in a plurality of columns, a plurality of bit lines respectively disposed in a plurality of rows which cross the plurality of word lines, and a plurality of anti-fuse type NVM cells respectively located at cross points of the plurality of word lines and the plurality of bit lines. Each of plurality of anti-fuse type. NVM cells includes a gate electrode connected to any one of the plurality of word lines, a drain connected to any one of the plurality of bit lines, and a source floated. The drains of the anti-fuse type NVM cells constituting each of the plurality of rows are connected to any one of the plurality of bit lines. The gate electrodes of the anti-fuse type NVM cells constituting each of the plurality of columns are connected to any one of the plurality of word lines.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "under", "beneath," "below", "lower," "on", "over," "above," "upper", "side" or "aside" another element, it can be directly contact the other element, or at least one intervening element may also be present therebetween. Accordingly, the terms such as "under", "beneath," "below", "lower," "on", "over", "above," "upper", "side" "aside" and the like which are used herein are for the purpose of describing particular embodiments only and are not intended to limit the scope of the present disclosure. Other words used to describe the relationship between elements or layers should be interpreted in a like fashion for example, "between" versus "directly between" or "adjacent" versus "directly adjacent".

It will be further understood that when an element is referred to as being "connected" or "coupled" to another element, it can be directly connected or coupled to the other element or intervening elements may be present. In contrast, when an element is referred to as being "directly connected" or "directly coupled" to another element, no intervening elements are present.

Figure 1:
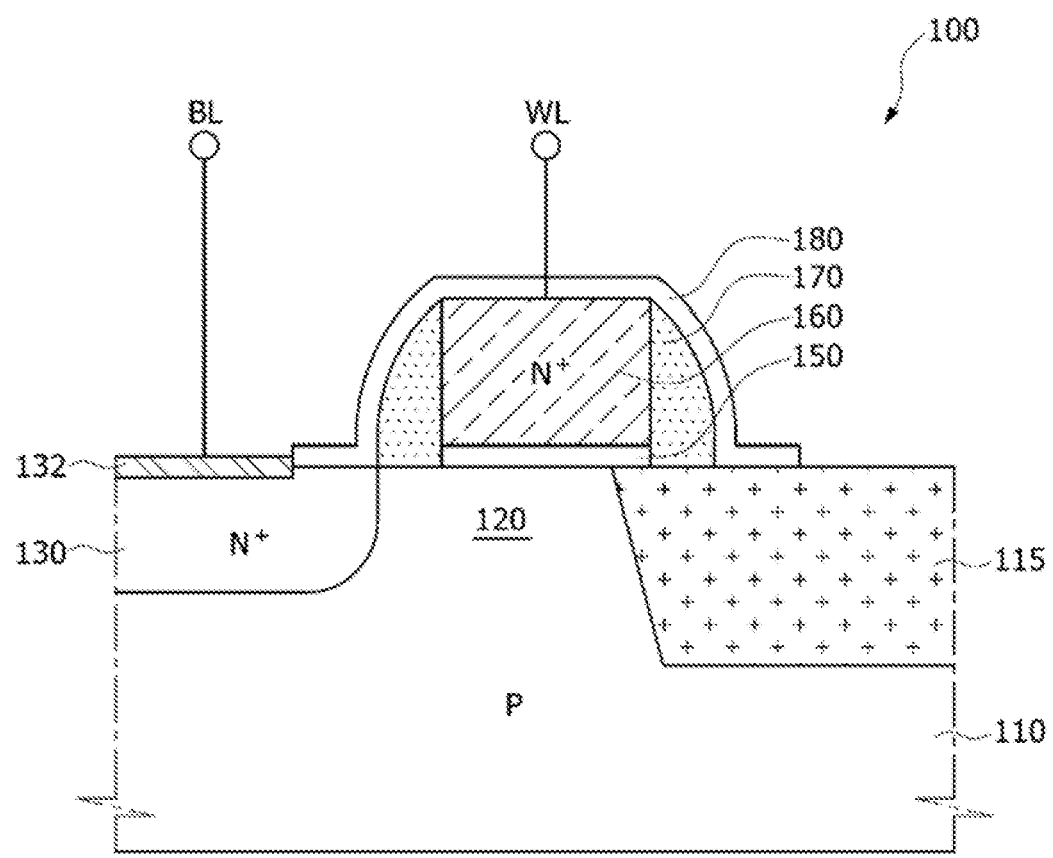
FIG. 1 is a cross-sectional view illustrating an anti-fuse type NVM cell according to an embodiment.

FIG. 1 is a cross-sectional view illustrating an anti-fuse type nonvolatile memory (NVM) cell 100 according to an embodiment.

Referring to FIG. 1, the anti-fuse type NVM cell 100 may have a half metal-oxide-semiconductor (MOS) transistor structure. Specifically, a trench isolation layer 115 may be disposed in a first upper portion of a semiconductor layer 110 having a first conductivity type for example, a P-type. In some embodiments, the semiconductor layer 110 may be a semiconductor substrate doped with P-type impurities. Alternatively, the semiconductor layer 110 may be a P-type junction region for example, a P-type well region formed in a semiconductor substrate. A junction region 130 having a second conductivity type for example, an N-type opposite to the first conductivity type may be disposed in a second upper region of the P-type semiconductor layer 110. A metal silicide layer 132 may be disposed on a portion of a top surface of the N-type junction region 130.

An upper portion of the P-type semiconductor layer 110 between the trench isolation layer 115 and the N-type junction region 130 may be defined as a channel region 120. The N-type junction region 130 may be comprised of only an N-type deep region of a lightly doped drain (LDD) structural region without an N-type extension region.

An anti-fuse insulation pattern 150 and a gate electrode 160 may be sequentially stacked on the channel region 120. In some embodiments, the anti-fuse insulation pattern 150 may include an oxide layer. The gate electrode 160 may include a polysilicon layer doped with N-type impurities. The anti-fuse insulation pattern 150 and the gate electrode 160 may be disposed on a portion of the channel region 120 and may extend onto a portion of the trench isolation layer 115.

A gate spacer 170 may be disposed on sidewalls of the anti-fuse insulation pattern 150 and the gate electrode 160. The gate spacer 170 may cover the channel region 120 adjacent to the N-type junction region 130. The gate spacer 170 may be used as an ion implantation mask during an ion implantation process for forming the N-type junction region 130. Thus, a sidewall of the N-type junction region 130 may be aligned with an outer sidewall of the gate spacer 170 adjacent to the N-type junction region 130.

The gate electrode 160 may be spaced apart from the N-type junction region 130 by a width of the gate spacer 170 in a horizontal direction. The gate spacer 170 on sidewalls of the anti-fuse insulation pattern 150 and the gate electrode 160 opposite to the N-type junction region 130 may be disposed on the trench isolation layer 115.

A silicidation blocking layer 180 may be disposed on a top surface of the N-type junction region 130 between the metal silicide layer 132 and the gate spacer 170, an outer side ail of the gate spacer 170, a top surface of the gate electrode 160, and a portion of a top surface of the trench isolation layer 115. The silicidation blocking layer 180 may prevent silicidation of a portion of the N-type junction region 130 adjacent to the channel region 120 and silicidation of the gate electrode 160 while the metal silicide layer 132 is formed. The silicidation blocking layer 180 may have a multi-layered structure including a plurality of insulation layers which are sequentially stacked.

The gate electrode 160 may be connected to a word line WL, and the N-type junction region 130 may be connected to a bit line BL through the metal silicide layer 132. The anti-fuse type NVM cell 100 may be programmed or may be under a read condition according to a bias applied to the N-type junction region 130 through the bit line BL and a bias applied to the gate electrode 160 through the word line WL while the P-type semiconductor layer 110 is grounded.

If the anti-fuse type NVM cell 100 is programmed, the anti-fuse insulation pattern 150 may be broken to provide a resistive path corresponding to an electrical short circuit between the channel region 120 and the gate electrode 160. In such a case, if the gate electrode 160 has an N-type conductivity and no inversion layer is formed in the P-type channel region 120, the N-type gate electrode 160, the P-type channel region 120 and the N-type junction region 130 may constitute a bipolar junction transistor (BJT).

Figure 2:
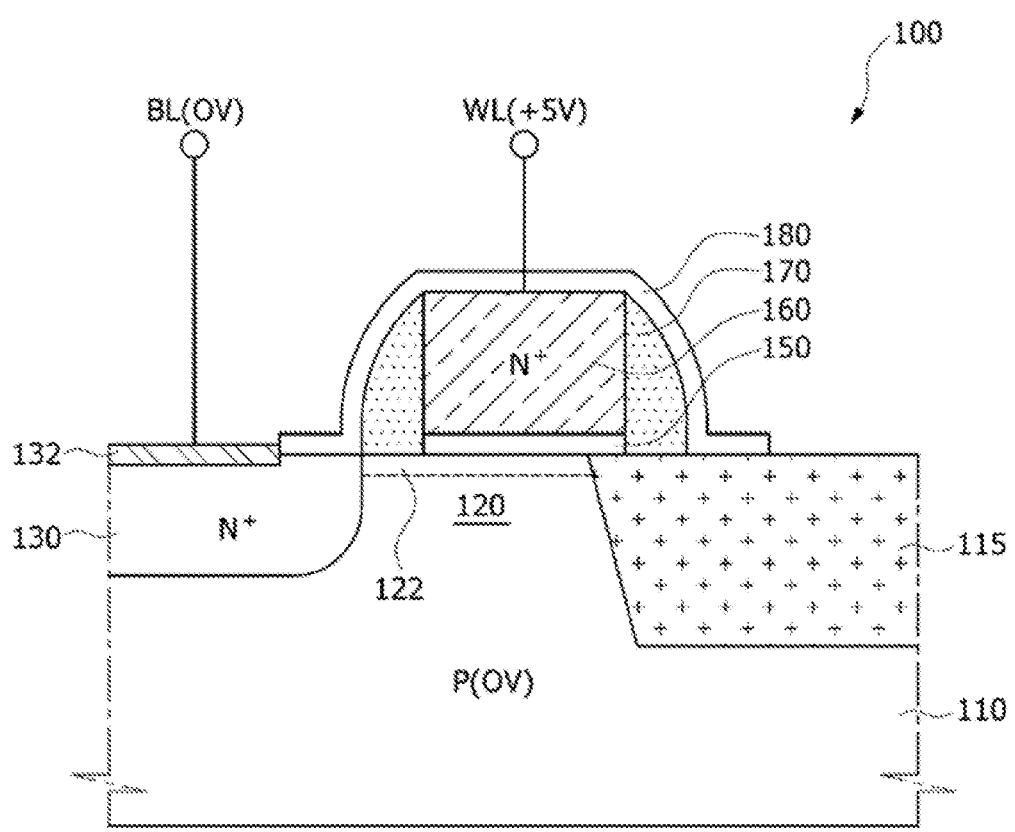
FIG. 2 is a cross-sectional view illustrating a method of programming the anti-fuse type NVM cell shown in FIG. 1.

FIG. 2 is a cross-sectional view illustrating a method of programming the anti-fuse type NVM cell 100 shown in FIG. 1. In FIG. 2, the same reference numerals as used in FIG. 1 denote the same elements.

Referring to FIG. 2, to program the anti-fuse type NVM cell 100, the P-type semiconductor layer 110 and the bit line BL may be grounded and a positive program voltage for example, +5 volts may be applied to the word line WL. The positive program voltage for example, +5 volts applied to the word line WL may be higher than a threshold voltage of the anti-fuse type NVM cell 100 having a MOS structure and a breakdown voltage of the anti-fuse insulation pattern 150. Thus, if the positive program voltage for example, +5 volts is applied to the word line WL, an N-type inversion layer 122 may be formed in the channel region 120. If a voltage drop between the bit line BL and the N-type inversion layer 122 is neglected, a ground voltage applied to the bit line BL may be transmitted to the N-type inversion layer 122.

Under the above bias condition, a voltage difference between the positive program voltage for example, +5 volts and the ground voltage may be created across the anti-fuse insulation pattern 150. Since the voltage difference is greater than a breakdown voltage of the anti-fuse insulation pattern 150, the anti-fuse insulation pattern 150 may be broken to provide a resistive path (155 of FIG. 3) between the N-type gate electrode 160 and the N-type inversion layer 122. The resistive path 155 may be formed in a vertical overlap region between the gate electrode 160 and the semiconductor layer 110 since there is no vertical overlap region between the gate electrode 160 and the N-type junction region 130.

Figure 3:
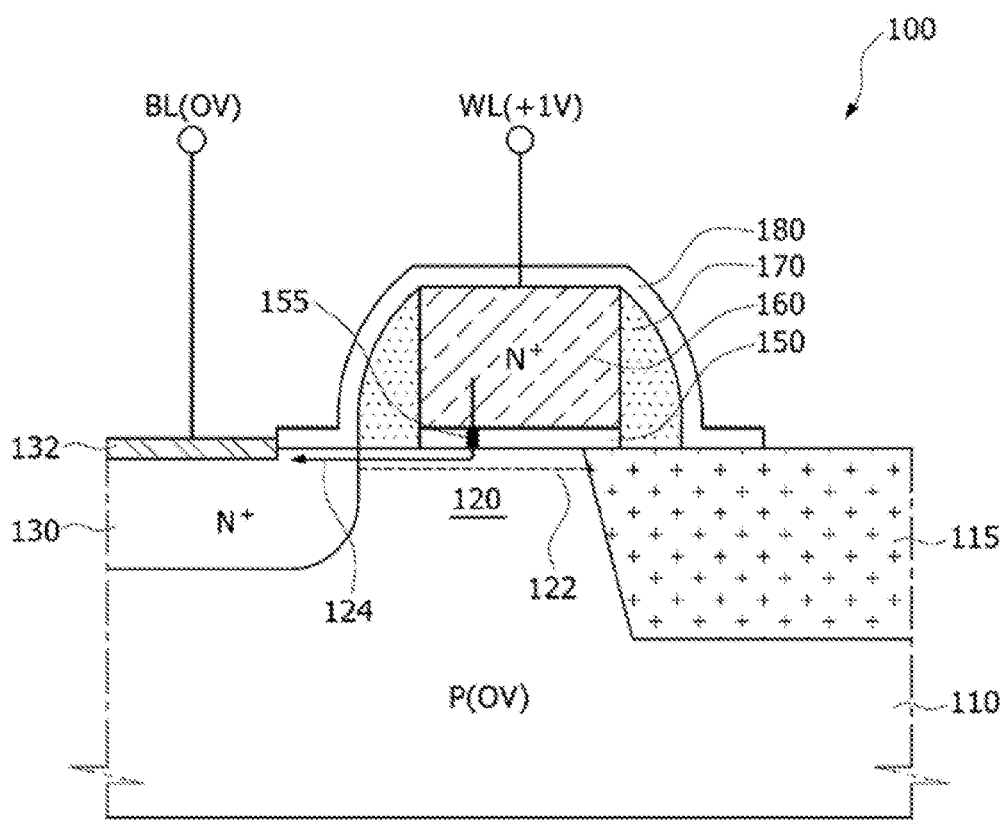
FIG. 3 is a cross-sectional view illustrating a method of reading the anti-fuse type NVM cell shown in FIG. 1.

FIG. 3 is a cross-sectional view illustrating a method of reading the anti-fuse type NVM cell 100 shown in FIG. 1. In FIG. 3 the same reference numerals used in FIG. 1 denote the same elements.

Referring to FIG. 3, to read a data stored in the anti-fuse type NVM cell 100, the P-type semiconductor layer 110 and the bit line BL may be grounded and a positive read voltage for example, +1 volt may be applied to the word line L. The positive read voltage for example, +1 volt applied to the word line WL may be higher than a threshold voltage of the anti-fuse type NVM cell 100 having a MOS structure and may be lower than a breakdown voltage of the anti-fuse insulation pattern 150. Thus, if the positive read voltage for example, +1 volt is applied to the word line WL, an N-type inversion layer 122 may be formed in the channel region 120. If a voltage drop between the bit line BL and the N-type inversion layer 122 is neglected, a ground voltage applied to the bit line BL may be transmitted to the N-type inversion layer 122.

Under the above bias condition, a voltage difference between the positive read voltage for example, +1 volt and the ground voltage may be created across the anti-fuse insulation pattern 150. In such a case, a current flowing from the word line WL towards the bit line BL may be determined according to presence or absence of a resistive path 155 in the anti-fuse insulation pattern 150. Specifically, if the anti-fuse type NVM cell 100 is programmed to provide the resistive path 155 in the anti-fuse insulation pattern 150, a current may flow from the word line WL towards the bit line BL through the resistive path 155 as indicated by an arrow 124 of FIG. 3. In contrast, if the anti-fuse type NVM cell 100 is not programmed, the resistive path 155 is not provided and no current flows from the word line WL towards the bit line BL. Accordingly, a data stored in the anti-fuse type NVM cell 100 may be read out by sensing a current flowing through the bit line BL.

Figure 4:
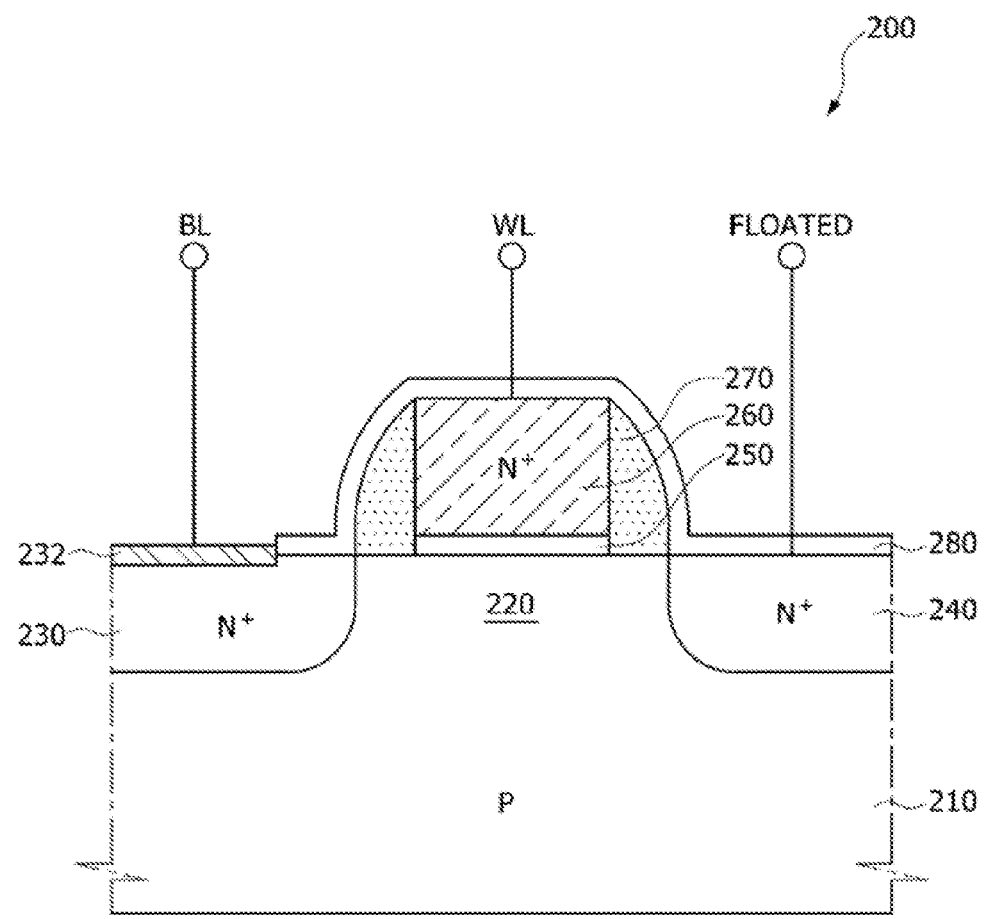
FIG. 4 is a cross-sectional view illustrating an anti-fuse type NVM cell according to another embodiment.

FIG. 4 is a cross-sectional view illustrating an anti-fuse type NVM cell 200 according to another embodiment.

Referring to FIG. 4, the anti-fuse type NVM cell 200 may have a full MOS transistor structure. Specifically, a first N-type junction region 230 and a second N-type junction region 240 may be disposed in a first upper portion and a second upper portion of a P-type semiconductor layer 210, respectively. In some embodiments, the P-type semiconductor layer 210 may be a semiconductor substrate doped with P-type impurities. Alternatively, the p-type semiconductor layer 210 may be a P-type junction region for example, a P-type well region formed in a semiconductor substrate. A metal silicide layer 232 may be disposed on a portion of a top surface of the first N-type junction region 230.

An upper portion of the P-type semiconductor layer 210 between the first N-type junction region 230 and the second N-type junction region 240 may be defined as a channel region 220. The first N-type junction region 230 may be comprised of only an N-type deep region of a lightly doped drain (LDD) structural region without an N-type extension region.

An anti-fuse insulation pattern 250 and a gate electrode 260 may be sequentially stacked on the channel region 220. In some embodiments, the anti-fuse insulation pattern 250 may include an oxide layer. The gate electrode 260 may include a polysilicon layer doped with N-type impurities. The anti-fuse insulation pattern 250 and the gate electrode 260 may be disposed on a portion of the channel region 220.

A gate spacer 270 may be disposed on sidewalls of the anti-fuse insulation pattern 250 and the gate electrode 260. The gate spacer 270 may be disposed to cover the channel region 220 adjacent to the first N-type junction region 230. The gate spacer 270 may be used as an ion implantation mask during an ion implantation process for forming the first N-type junction region 230. Thus a sidewall of the first N-type junction region 230 may be aligned with an outer sidewall of the gate spacer 270 adjacent to the first N-type junction region 230. Accordingly, the gate electrode 260 may be spaced apart from the first N-type junction region 230 by a width of the gate spacer 270 in a horizontal direction.

The gate spacer 270 may also be disposed to cover the channel region 220 adjacent to the second N-type junction region 240. The gate spacer 270 may be used as an ion implantation mask during an ion implantation process for forming the second N-type junction region 240. Thus, a sidewall of the second N-type junction region 240 may be aligned with an outer sidewall of the gate spacer 270 adjacent to the second N-type junction region 240. Accordingly, the gate electrode 260 may be spaced apart from the second N-type junction region 240 by a width of the gate spacer 270 in a horizontal direction.

A silicidation blocking layer 280 may be disposed on a top surface of the first. N-type junction region 230 between the metal silicide layer 232 and the gate spacer 270, an outer sidewall of the gate spacer 270, a top surface of the gate electrode 260, and a top surface of the second N-type junction region 240. The silicidation blocking layer 280 may prevent silicidation of a portion of the first N-type junction region 230 adjacent to the channel region 220, silicidation of the gate electrode 160 and silicidation of the second N-type junction region 240 while the metal silicide layer 232 is formed. The silicidation blocking layer 280 may have a multi-layered structure including a plurality of insulation layers which are sequentially stacked.

The gate electrode 260 may be connected to a word line WL, and the first N-type junction region 230 may be connected to a bit line BL through the metal silicide layer 232. The second N-type junction region 240 may be floated. The anti-fuse type NVM cell 200 may be programmed or may be under a read condition according to a bias applied to the first N-type junction region 230 through the bit line BL and a bias applied to the gate electrode 260 through the word line WL while the P-type semiconductor layer 210 is grounded. The second N-type junction region 240 may not affect a program operation and a read operation of the anti-fuse type NVM cell 200.

Methods of programming and reading the anti-fuse type NVM cell 200 may be substantially the same as the methods of programming and reading the anti-fuse type NVM cell 100 which are described with reference to FIGS. 2 and 3. If the anti-fuse type NVM cell 200 is programmed, the anti-fuse insulation pattern 250 may be broken to provide a resistive path corresponding to an electrical short circuit between the channel region 220 and the gate electrode 260. In such a case, if the gate electrode 260 has an N-type conductivity and no inversion layer is formed in the P-type channel region 220 the N-type gate electrode 260, the P-type channel region 220 and the first N-type junction region 230 may constitute a bipolar junction transistor (BJT).

Figure 5:
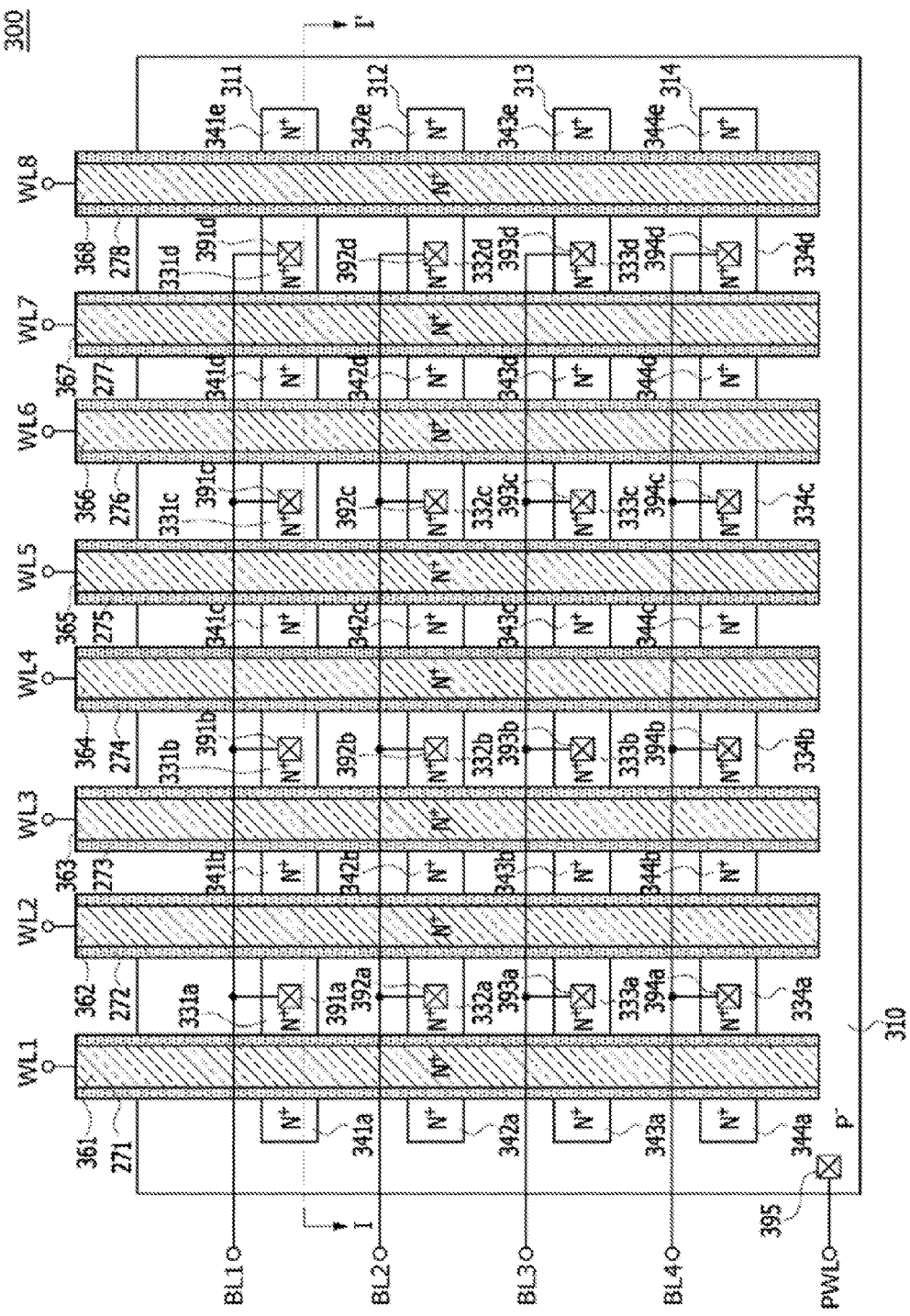
FIG. 5 is a layout diagram illustrating an anti-fuse type NVM cell array according to an embodiment.

FIG. 5 is a layout diagram illustrating an anti-fuse type NVM cell array 300 according to an embodiment. The anti-fuse type NVM cell array 300 may be configured by two dimensionally arraying the anti-fuse type NVM cell 200 shown in FIG. 4. Alternatively, the anti-fuse type NVM cell array 300 may be configured by two dimensionally arraying the anti-fuse type NVM cell 100 shown in FIG. 1.

Referring to FIG. 5, the anti-fuse type NVM cell array 300 may include first to fourth active regions 311 to 314 which are disposed in a P-type well region 310. Each of the first to fourth active regions 311 to 314 may be disposed to have a stripe shape extending in a first direction for example, a horizontal direction. The first to fourth active regions 311 to 314 may be spaced apart from each other in a second direction for example, a vertical direction intersecting the first direction.

A plurality of first N-type junction regions 331a to 331d and a plurality of second N-type junction regions 341a to 341e may be disposed in the first active region 311. In some embodiments, the second N-type junction regions 341a to 341e and the first N-type junction regions 331a to 331d may be alternately arrayed from one end of the first active region 311 towards the other end of the first active region 311 in the first direction. A plurality of first N-type junction regions 332a to 332d and a plurality of second N-type junction regions 342a to 342e may be disposed in the second active region 312. In some embodiments, the second N-type junction regions 342a to 342e and the first N-type junction regions 332a to 332d may be alternately arrayed from one end of the second active region 312 toward the other end of the second active region 312 in the first direction. A plurality of first N-type junction regions 333a to 333d and a plurality of second N-type junction regions 343a to 343e may be disposed in the third active region 313. In some embodiments, the second N-type junction regions 343a to 343e and the first N-type junction regions 333a to 333d may be alternately arrayed from one end of the third active region 313 toward the other end of the third active region 313 in the first direction. A plurality of first N-type junction regions 334a to 334d and a plurality of second N-type junction regions 344a to 344e may be disposed in the fourth active region 314. In some embodiments, the second N-type junction regions 344a to 344e and the first N-type junction regions 334a to 334d may be alternately arrayed from one end of the fourth active region 314 toward the other end of the fourth active region 314 in the first direction.

First to eighth gate electrodes 361 to 368 may be disposed to cross the first to fourth active regions 311 to 314. Specifically, the first gate electrode 361 may extend in the second direction to overlap with the first active region 311 between the first and second N-type junction regions 331a and 341a, the second active region 312 between the first and second N-type junction regions 332a and 342a, the third active region 313 between the first and second N-type junction regions 333a and 343a, and the fourth active region 314 between the first and second N-type junction regions 334a and 344a.

The second gate electrode 362 may extend in the second direction to overlap the first active region 311 between the first and second N-type junction regions 331a and 341b, the second active region 312 between the first and second N-type junction regions 332a and 342b, the third active region 313 between the first and second N-type junction regions 333a and 343b, and the fourth active region 314 between the first and second N-type junction regions 334a and 344b.

The third gate electrode 363 may extend in the second direction to overlap with the first active region 311 between the first and second N-type junction regions 331b and 341b, the second active region 312 between the first and second N-type junction regions 332b and 342b, the third active region 31 between the first and second N-type junction regions 333b and 343b, and the fourth active region 314 between the first and second N-type junction regions 334b and 344b.

The fourth gate electrode 364 may extend in the second direction to overlap the first active region 311 between the first and second N-type junction regions 331b and 341c, the second active region 312 between the first and second N-type junction regions 332b and 342c, the third active region 313 between the first and second N-type junction regions 333b and 343c, and the fourth active region 314 between the first and second N-type junction regions 334b and 344c.

The fifth gate electrode 365 may extend in the second direction to overlap the first active region 311 between the first and second N-type junction regions 331c and 341c, the second active region 312 between the first and second N-type junction regions 332c and 342c the third active region 313 between the first and second N-type junction regions 333c and 343c, and the fourth active region 314 between the first and second N-type junction regions 334c and 344c.

The sixth gate electrode 366 may extend in the second direction to overlap the first active region 311 between the first and second N-type junction regions 331c and 341d, the second active region 312 between the first and second N-type junction regions 332c and 342d, the third active region 313 between the first and second N-type junction regions 333c and 343d, and the fourth active region 314 between the first and second N-type junction regions 334c and 344d.

The seventh gate electrode 367 may extend in the second direction to overlap with the first active region 311 between the first and second N-type junction regions 331d and 341d, the second active region 312 between the first and second N-type junction regions 332d and 342d, the third active region 313 between the first and second N-type junction regions 333d and 343d, and the fourth active region 314 between the first and second N-type junction regions 334d and 344d.

The eighth gate electrode 368 may extend in the second direction to overlap the first active region 311 between the first and second N-type junction regions 331d and 341e, the second active region 312 between the first and second N-type junction regions 332d and 342e, the third active region 313 between the first and second N-type junction regions 333d and 343e, and the fourth active region 314 between the first and second N-type junction regions 334d and 344e.

In some embodiments, each of the first to eighth gate electrodes 361 to 368 may intersect the first to fourth active regions 311 to 314 at a right angle to have a stripe shape extending in the second direction. First to eighth gate spacers 371 to 378 may be disposed on sidewalls of the first to eighth gate electrodes 361 to 368, respectively.

Although not shown in FIG. 5, anti-fuse insulation patterns may be disposed between the first to eighth gate electrodes 361 to 368 and the first to fourth active regions 311 to 314.

The first gate electrode 361 and the first gate spacer 71 may extend to overlap channel regions between the first N-type junction regions 331a to 334a and the second N-type junction regions 341a to 344a, and the second gate electrode 362 and the second gate spacer 372 may extend to overlap channel regions between the first N-type junction regions 331a to 334a and the second N-type junction regions 341b to 344b.

The third first gate electrode 363 and the third gate spacer 373 may extend to overlap channel regions between the first N-type junction regions 331b to 334b and the second N-type junction regions 341b to 344b, and the fourth gate electrode 364 and the fourth gate spacer 374 may extend to overlap channel regions between the first N-type junction regions 331b to 334b and the second N-type junction regions 341c to 344c.

The fifth gate electrode 365 and the fifth gate spacer 375 may extend to overlap channel regions between the first N-type junction regions 331c to 334c and the second N-type junction regions 341c to 344c, and the sixth gate electrode 366 and the sixth gate spacer 376 may extend to overlap channel regions between the first N-type junction regions 331c to 334c and the second N-type junction regions 341d to 344d.

The seventh gate electrode 367 and the seventh gate spacer 377 may extend to overlap channel regions between the first N-type junction regions 331d to 334d and the second N-type junction regions 341d to 344d, and the eighth gate electrode 368 and the eighth gate spacer 378 may extend to overlap channel regions between the first N-type junction regions 331d to 334d and the second N-type junction regions 341e to 344e.

Thus, when viewed from a plane view, two adjacent ones among the first to eighth gate electrodes 371 to 378 may be spaced part from each other by a width of each first N-type junction region or a width of each second N-type junction region in the first direction plus twice a width of each of the first to eighth gate spacers 371 to 378 in the first direction.

The first to eighth gate electrodes 361 to 368 may be connected to first to eighth word lines WL1 to WL8 respectively. The first N-type junction regions 331a to 331d in the first active region 311 may be connected to a first bit line BL1 through contacts 391a to 391d, respectively. The first N-type junction regions 332a to 332d in the second active region 312 may be connected to a second bit line BL2 through contacts 392a to 392d, respectively. The first N-type junction regions 333a to 333d in the third active region 313 may be connected to a third bit line BL3 through contacts 393a to 393d, respectively. The first N-type junction regions 334a to 334d in the fourth active region 314 may be connected to a fourth bit line BL4 through contacts 394a to 394d, respectively. The P-type well region 310 may be connected to a P-well bias line PWL through a contact 395.

Figure 6:
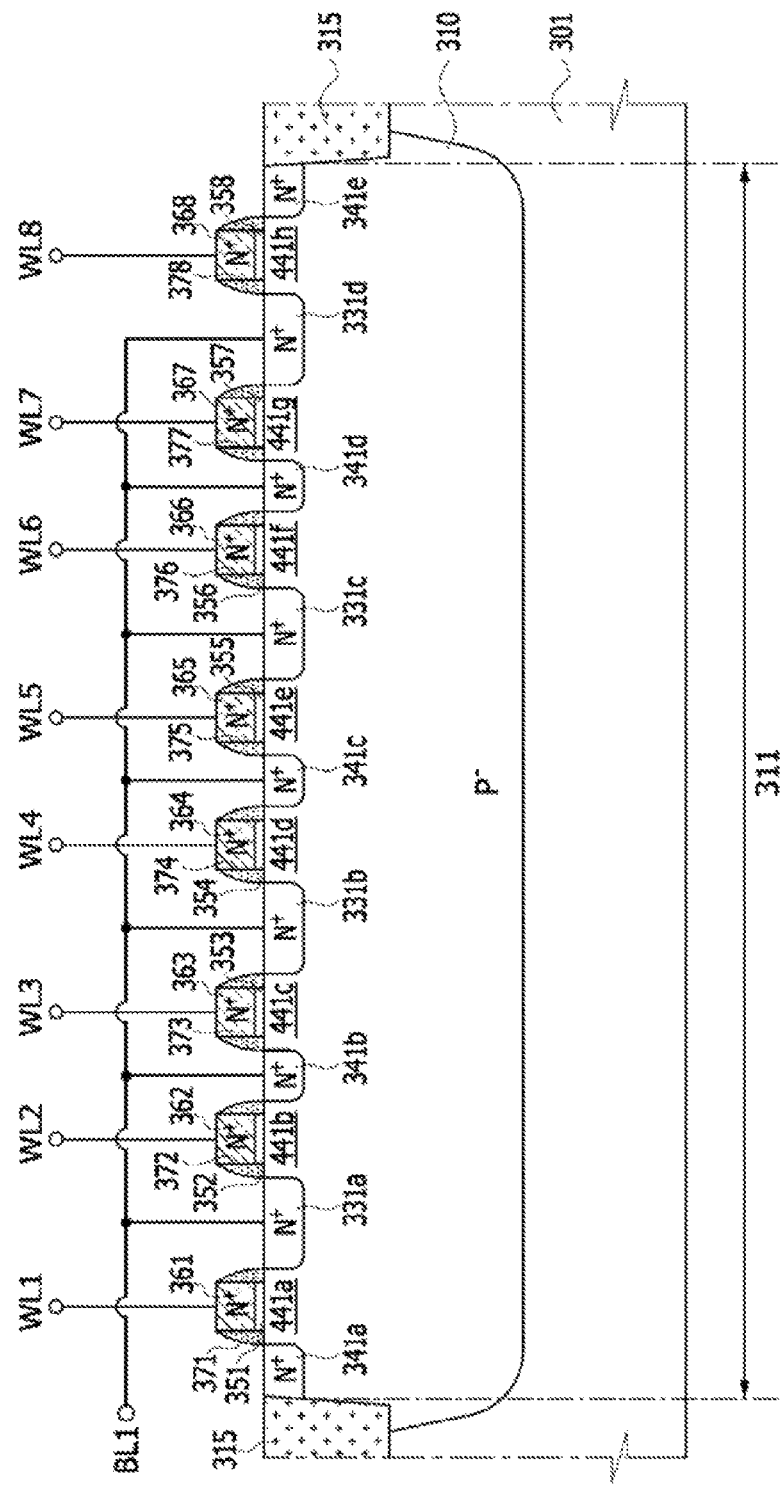
FIG. 6 is a cross-sectional view taken along a line I-I' of FIG. 5.

FIG. 6 is a cross-sectional view taken along a line I-I' of FIG. 5.

Referring to FIG. 6, a trench isolation layer 315 may be disposed in an upper portion of a substrate 301 having the P-type well region 310. The first active region 311 may be defined by the trench isolation layer 315. The first active region 311 may be surrounded by the P-type well region 310. The second N-type junction regions 341a to 341e and the first N-type junction regions 331a to 331d may be alternately arrayed in an upper portion of the first active region 311 defined in the P-type well region 310.

Upper portions of the P-type well region 310 or the first active region 311 between the first N-type junction regions 331a to 331d and the second N-type junction regions 341a to 341e may be defined as channel regions. For example, an upper portion of the P-type well region 310 between the second N-type junction region 341a and the first N-type junction region 331a may be defined as a first channel region 441a. An upper portion of the P-type well region 310 between the first N-type junction region 331a and the second N-type junction region 341b may be defined as a second channel region 441b. An upper portion of the P-type well region 310 between the second N-type junction region 341b and the first N-type junction region 331b may be defined as a third channel region 441c. An upper portion of the P-type well region 310 between the first N-type junction region 331b and the second N-type junction region 341c may be defined as a fourth channel region 441d. An upper portion of the P-type well region 310 between the second N-type junction region 341c and the first N-type junction region 331c may be defined as a fifth channel region 441e. An upper portion of the P-type well region 310 between the first N-type junction region 331c and the second N-type junction region 341d may be defined as a sixth channel region 441f. An upper portion of the P-type well region 310 between the second N-type junction region 341d and the first N-type junction region 331d may be defined as a seventh channel region 441g. An upper portion of the P-type well region 310 between the first N-type junction region 331d and the second N-type junction region 341e may be defined as an eighth channel region 441h.

First to eighth anti-fuse insulation patterns 351 to 358 may be disposed on the first to eighth channel regions 441a to 441h, respectively. The first to eighth gate electrodes 361 to 368 may be stacked on the first to eighth anti-fuse insulation patterns 351 to 358, respectively. The first to eighth gate spacers 361 to 368 may be disposed on sidewalls of the first to eighth gate electrodes 361 to 368, respectively. The first to eighth gate spacers 361 to 368 may extend onto sidewalls of the first to eighth anti-fuse insulation patterns 351 to 358, respectively. The first to eighth gate electrodes 361 to 368 may be connected to the first to eighth word lines WL1 to WL8, respectively. The first N-type junction regions 331a to 331d may be connected to the first bit line BL1 in common. The second N-type junction regions 341a to 341e may be floated.

Figure 7:
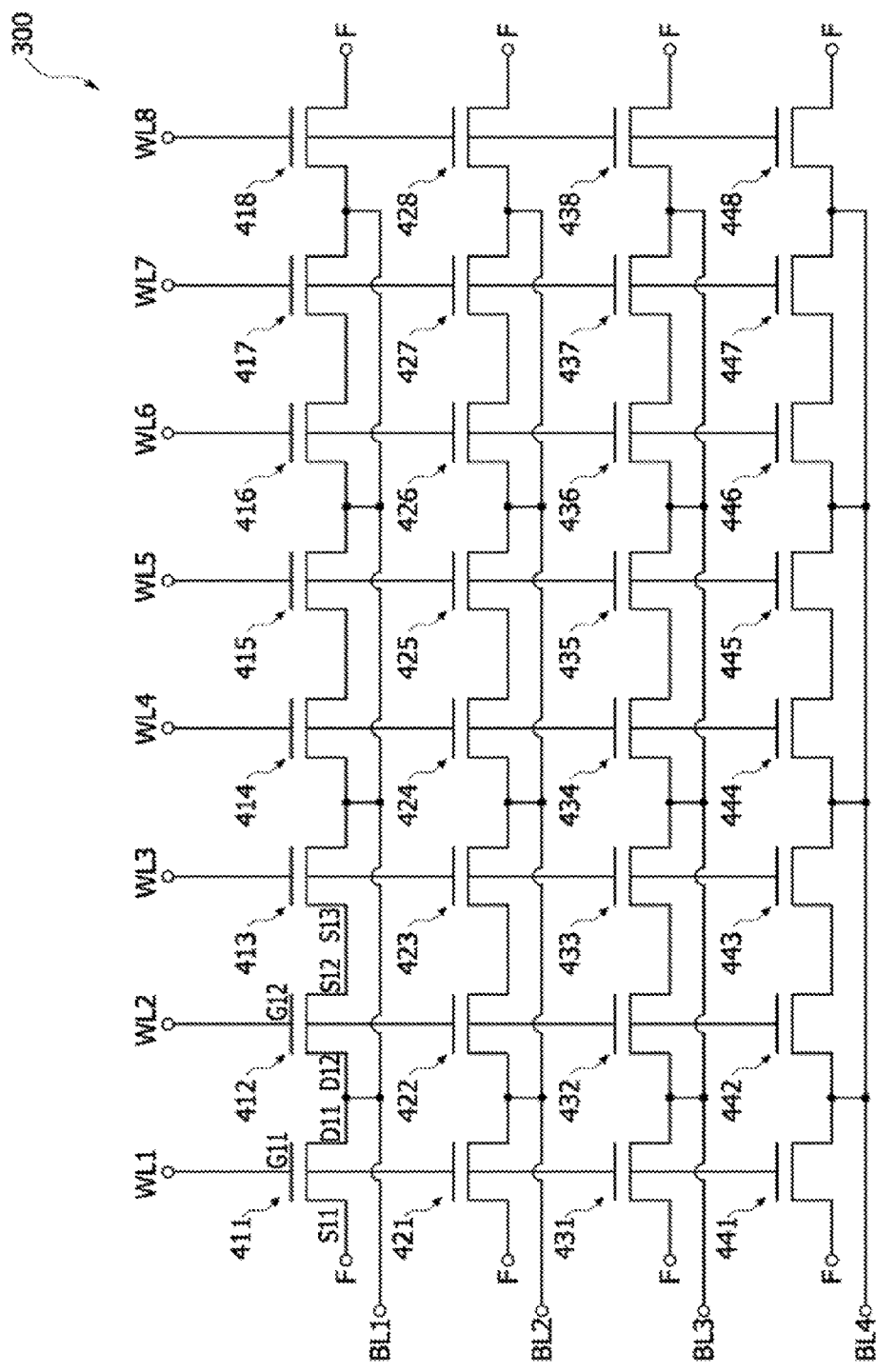
FIG. 7 is an equivalent circuit diagram of the anti-fuse type NVM cell array shown in FIG. 5.

FIG. 7 is an equivalent circuit diagram of the anti-fuse type NVM cell array 300 shown in FIG. 5.

Referring to FIG. 7, the anti-fuse type NVM cell array 300 may include a plurality of word lines such as the first to eighth word nines WL1 to WL8 and a plurality of bit lines such as the first to fourth bit lines BL1 to BL4. The number of the word lines and the number of the bit lines are not limited to the example illustrated in FIG. 7.

The first to eighth word lines WL1 to WL8 may be disposed to intersect the first to fourth bit lines BL1 to BL4. A plurality of unit cells 411 to 418, 421 to 428, 431 to 438 and 441 to 448 may be located at cross points of the first to eighth word lines WL1 to WL8 and the first to fourth bit lines BL1 to BL4, respectively.

The unit cells 411 to 418 may be disposed in a first row and may share the first bit line BL1 with each other. The unit cells 421 to 428 may be disposed in a second row and may share the second bit line BL2 with each other. The unit cells 431 to 438 may be disposed in a third row and may share the third bit line BL3 with each other. The unit cells 441 to 448 may be disposed in a fourth row and may share the fourth bit line BL4 with each other. The unit cells 411, 421, 431 and 441 may be disposed in a first column and may share the first word line WL1 with each other. The unit cells 412, 422, 432 and 442 may be disposed in a second column and may share the second word line WL2 with each other. The unit cells 413, 423, 433 and 443 may be disposed in a third column and may share the third word line WL3 with each other. The unit cells 414, 424, 434 and 444 may be disposed in a fourth column and may share the fourth word line WL4 with each other. The unit cells 415, 425, 435 and 445 may be disposed in a fifth column and may share the fifth word line WL5 with each other. The unit cells 416, 426, 436 and 446 may be disposed in a sixth column and may share the sixth word line WL6 with each other. The unit cells 417, 427, 437 and 447 may be disposed in a seventh column and may share the seventh word line WL7 with each other. The unit cells 418, 428, 438 and 448 may be disposed in an eighth column and may share the eighth word line WL8 with each other.

Each of the unit cells 411 to 418, 421 to 428, 431 to 438 and 441 to 448 may correspond to the anti-fuse type memory cell 100 described with reference to FIG. 1 or the anti-fuse type memory cell 200 described with reference to FIG. 4. For example, the unit cell 411 located at a cross point of the first row and the first column may have a drain D11 connected to the first bit line BL1, a source S11 which is floated, and a gate electrode G11 connected to the first word line WL1. Similarly, the unit cell 412 located at a cross point of the first row and the second column may have a drain D12 connected to the first bit line BL1, a source S12 which is floated, and a gate electrode G12 connected to the second word line WL2. In each row, one unit cell connected to an $i^{th}$ word line WLi where, "i" indicates an odd number may share a drain with another unit cell connected to an $(i+1)^{th}$ word line WLi+1. Moreover, in each row, one unit cell connected to an $i^{th}$ word line WLi may share a source with another unit cell connected to an $(i-1)^{th}$ word line WLi-1.

Figure 8:
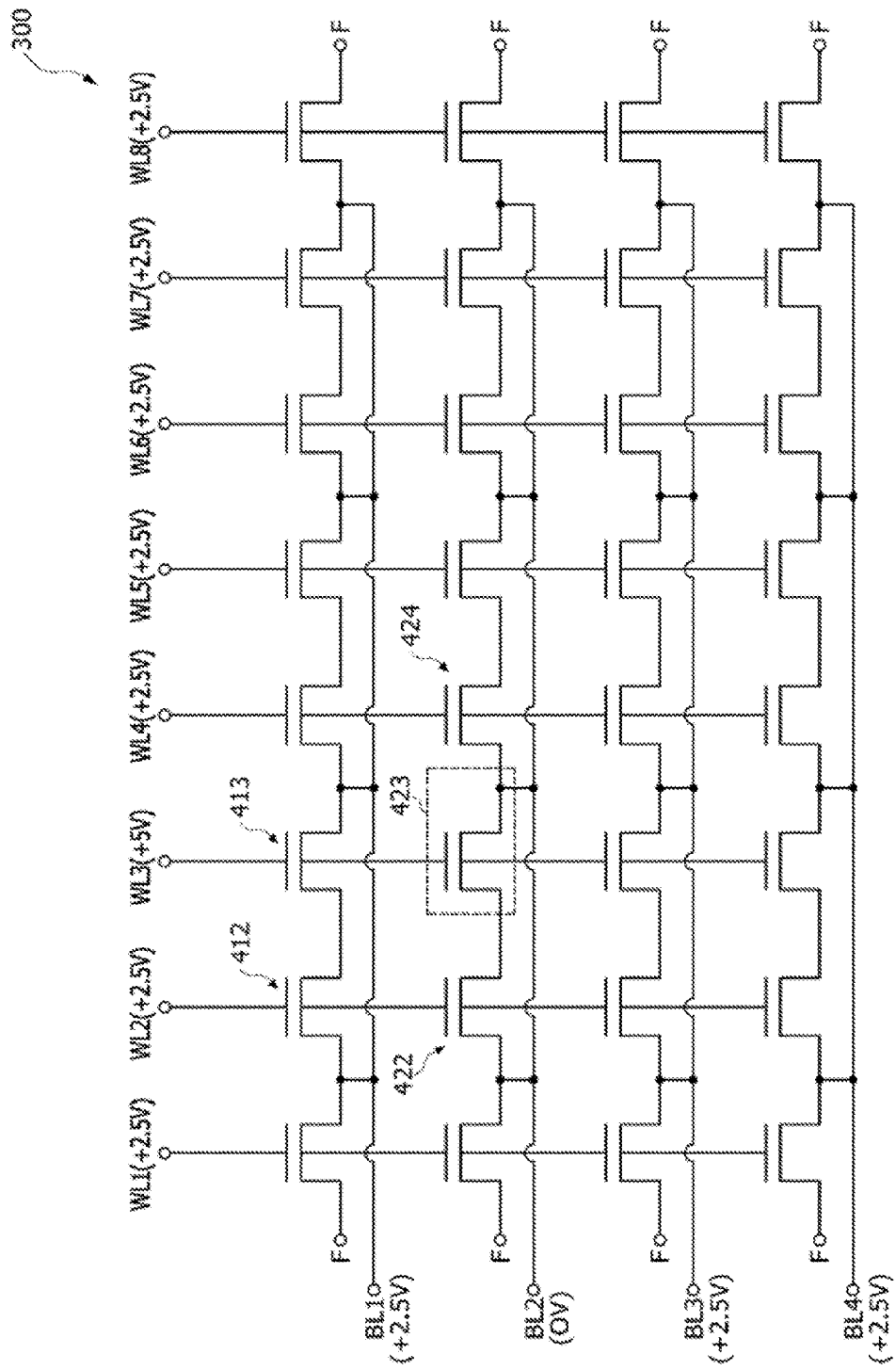
FIG. 8 is an equivalent circuit diagram illustrating a method of programming the anti-fuse type NVM cell array shown in FIG. 5.

FIG. 8 is an equivalent circuit diagram illustrating a program operation of the anti-fuse type NVM cell array 300 shown in FIG. 5. The program operation of the anti-fuse type NVM cell array 300 will be described in conjunction with an example in which the unit cell 423 hereinafter, referred to as a selected unit cell, located at a cross point of the second row and the third column is selectively programmed.

As illustrated in FIG. 8, to program the selected unit cell 423, a positive program voltage for example, +5 volts may be applied to the third word line WL3 connected to the selected unit cell 423 and a positive word line voltage for example, +2.5 volts may be applied to the remaining word lines WL1, WL2 and WL4 to WL8 while the P-type well region 310 is grounded. The positive program voltage may be higher than a breakdown voltage of the anti-fuse insulation patterns, and the positive word line voltage may be lower than the breakdown voltage of the anti-fuse insulation patterns. In addition, a ground voltage may be applied to the second bit line BL2 connected to the selected unit cell 423, and a positive bit line voltage for example, +2.5 volts may be applied to the remaining bit lines BL1, BL3 and BL4. The positive bit line voltage may be lower than the breakdown voltage of the anti-fuse insulation patterns. In some embodiments, the positive bit line voltage may be equal to the positive word line voltage.

Under the above program bias condition, the anti-fuse insulation pattern of the selected unit cell 423 may be broken to provide a resistive path. As a result, the selected unit cell 423 may be programmed. While the selected unit cell 423 is programmed, a program operation of non-selected unit cells such as, the unit cell 413 located at a cross point of the first row and the third column, sharing the third word line WL3 with the selected unit cell 423 may be prohibited. In addition, while the selected unit cell 423 is programmed, a program operation of other non-selected unit cells such as, the unit cell 422 located at a cross point of the second row as well as the second column and the unit cell 424 located at a cross point of the second row and the fourth column, sharing the second bit word line BL2 with the selected unit cell 423 may also be prohibited. Furthermore, while the selected unit cell 423 is programmed, a program operation of the remaining non-selected unit cells such as, the unit cell 412 located at a cross, point of the first row and the second column, which does not share the third word line WL3 and the second bit word line BL2 with the selected unit cell 423, may also be prohibited.

Figure 9:
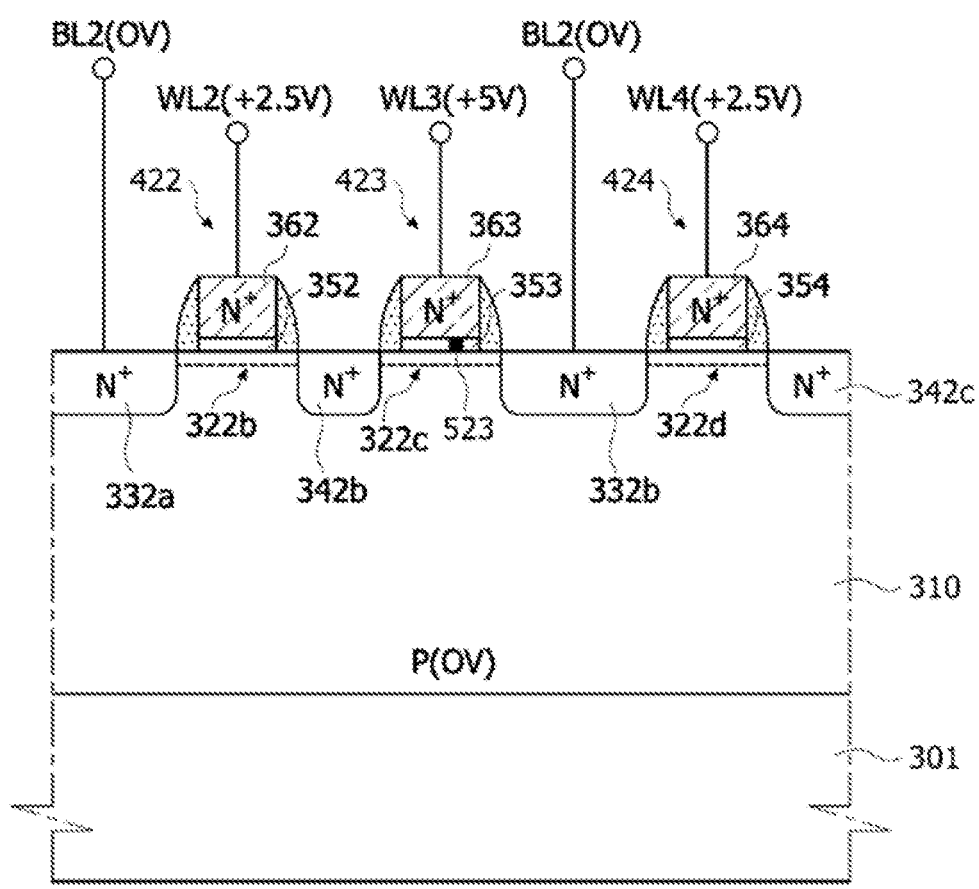
FIG. 9 is a cross-sectional view illustrating a program operation of a selected memory cell in the anti-fuse type NVM cell array shown in FIG. 8 and a program inhibition operation of a non-selected memory cell sharing a bit line with the selected memory cell of FIG. 8.

FIG. 9 is a cross-sectional view illustrating a program mechanism of the selected memory cell 423 in the anti-fuse type NVM cell array 300 shown in FIG. 8 and a program inhibition mechanism of the non-selected memory cells 422 and 424 sharing the second bit line BL2 with the selected memory cell 423 of FIG. 8.

Referring to FIG. 9, since the positive program voltage for example, +5 volts is applied to the third word line WL3, an inversion layer 322c may be formed in a channel region of the selected memory cell 423. In such a case, a ground voltage applied to the second bit line BL2 may be transmitted to the inversion layer 322c through the first N-type junction region 332b. Thus, a voltage difference of 5 volts may be created across the anti-fuse insulation pattern 353 between the gate electrode 363 and the inversion layer 322c of the selected unit cell 423. This voltage difference of 5 volts may cause a breakdown phenomenon of the anti-fuse insulation pattern 353 to form a resistive path 523 in the anti-fuse insulation pattern 353.

Since the positive word line voltage for example, +2.5 volts is applied to the second word line WL2, an inversion layer 322b may be formed in a channel region of the non-selected unit cell 422, which is located at a cross point of the second row and the second column, and shares the second bit line BL2 with the selected unit cell 423. In such a case, a ground voltage applied to the second bit line BL2 may be transmitted to the inversion layer 322b through the first N-type junction region 332a. Thus, a voltage difference of 2.5 volts may be created across the anti-fuse insulation pattern 352 between the gate electrode 362 and the inversion layer 322b of the non-selected unit cell 422. Since the voltage difference of 2.5 volts is less than a breakdown voltage of the anti-fuse insulation pattern 352, the non-selected unit cell 422 may not be programmed.

Similarly, since the positive word line voltage for example, +2.5 volts is applied to the fourth word line WL4, an inversion layer 322d may be formed in a channel region of the non-selected unit cell 424, which is located at a cross point of the second row and the fourth column, and shares the second bit line BL2 with the selected unit cell 423. In such a case, a ground voltage applied to the second bit line BL2 may be transmitted to the inversion layer 322d through the first N-type junction region 332b. Thus, a voltage difference of 2.5 volts may be created across the anti-fuse insulation pattern 354 between the gate electrode 364 and the inversion layer 322d of the non-selected unit cell 424. Since the voltage difference of 2.5 volts is less than a breakdown voltage of the anti-fuse insulation pattern 354, the non-selected unit cell 424 may not be programmed.

While the selected unit cell 423 is programmed, the second N-type junction regions 342b and 342c may be floated. A program operation of the other non-selected unit cells sharing the second bit line BL2 with the selected unit cell 423 may also be prohibited by the same mechanism as described above.

Figure 10:
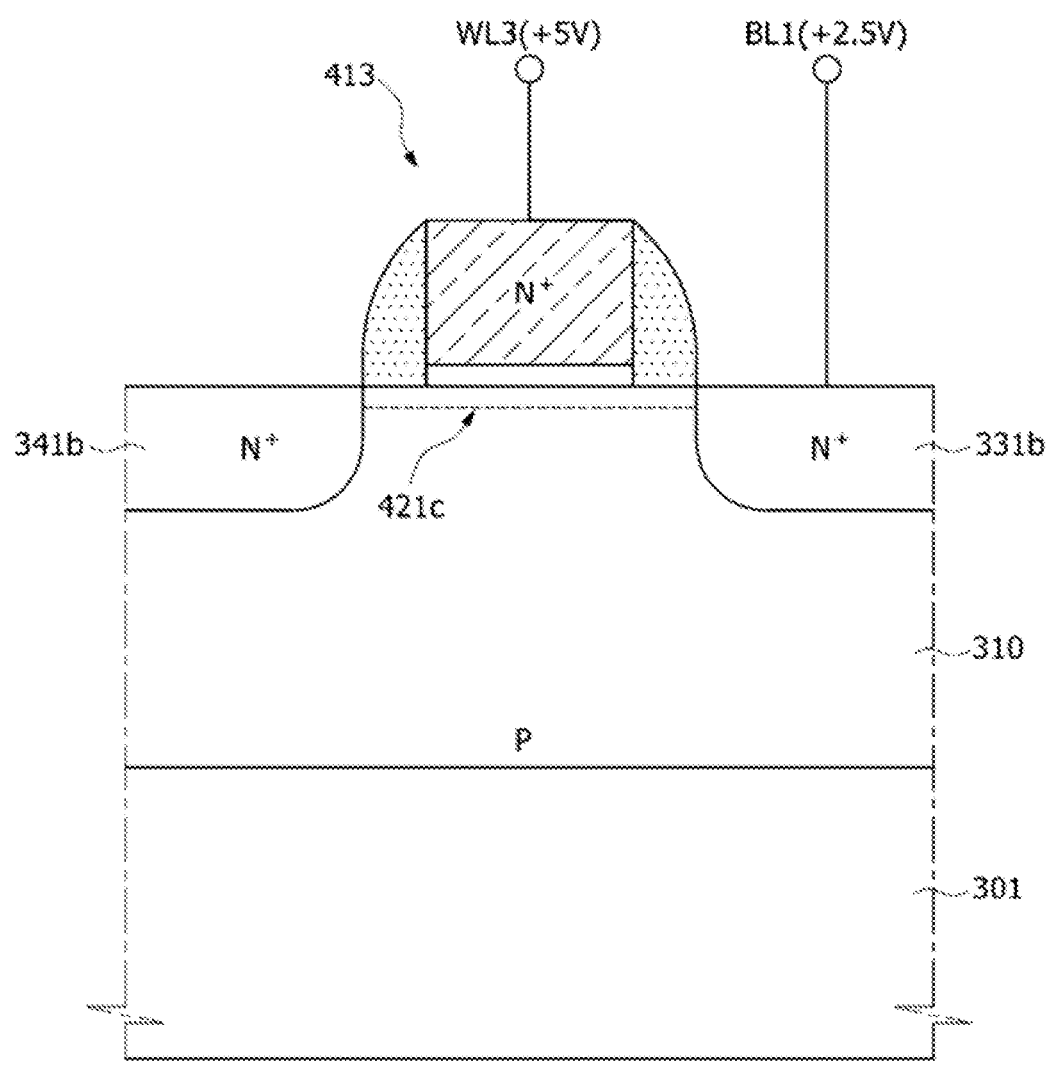
FIG. 10 is a cross-sectional view illustrating a program inhibition operation of a non-selected memory cell sharing a word line with a selected memory cell of the anti-fuse type NVM cell array shown in FIG. 8.

FIG. 10 is a cross-sectional view illustrating a program inhibition mechanism of a non-selected memory cell 413 sharing the third word line WL3 with the selected memory cell 423 of FIG. 8.

Referring to FIG. 10, since the positive program voltage for example, +5 volts is applied to the third word line WL3 an inversion layer 321c may be formed in a channel region of the non selected memory cell 413, which is located at a cross point of the first row and the third column, and shares the third word line WL3 with the selected unit cell 423. In such a case, a positive bit line voltage for example, 2.5 volts applied to the first bit line BL1 may be transmitted to the inversion layer 321c through the first N-type junction region 331b. Thus, a voltage difference of 2.5 volts may be created across an anti-fuse insulation pattern between the gate electrode and the inversion layer 321c of the non-selected unit cell 413. Since the voltage difference of 2.5 volts is less than a breakdown voltage of the anti-fuse insulation pattern of the non-selected unit cell 413, the non-selected unit cell 413 may not be programmed.

A program operation of the other non-selected unit cells sharing the third word line WL3 with the selected unit cell 423 may also be prohibited by the same mechanism as described above.

Figure 11:
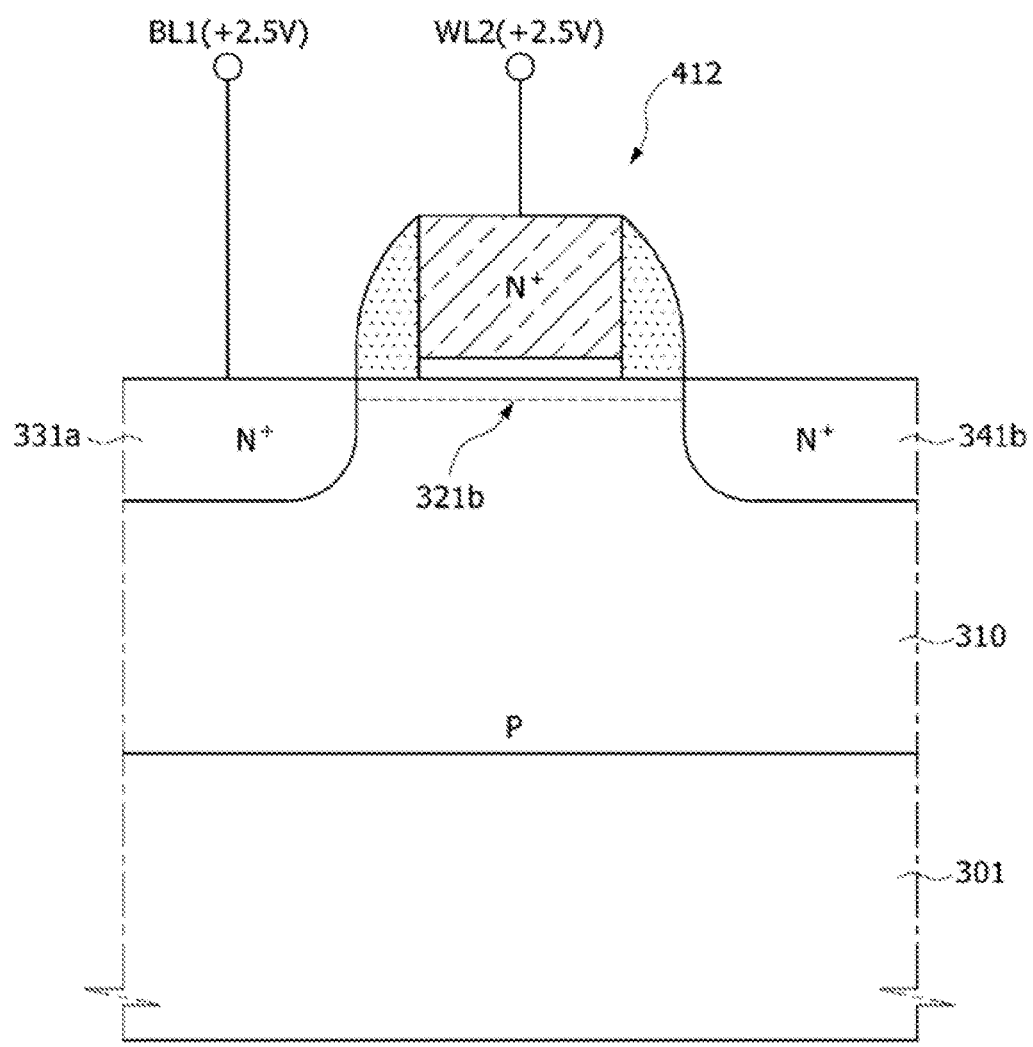
FIG. 11 is a cross-sectional view illustrating a program inhibition operation of a non-selected memory cell that does not share any word lines and any bit lines with a selected memory cell of the anti-fuse type NVM cell array shown in FIG. 8.

FIG. 11 is a cross-sectional view illustrating a program inhibition mechanism of a non-selected memory cell 412 that does not share any word lines and any bit lines with the selected memory cell 423 of FIG. 8.

Referring to FIG. 11, since the positive word line voltage for example, +2.5 volts is applied to the second word line WL2, an inversion layer 321b may be formed in a channel region of the non-selected memory cell 412, which is located at a cross point of the first row and the second column, and does not share any word lines and any bit lines with the selected unit cell 423. In such a case, a positive bit line voltage for example, 2.5 volts applied to the first bit line BL1 may be transmitted to the inversion layer 321b through the first N-type junction region 331a. Thus, no voltage difference may be created across an anti-fuse insulation pattern between the gate electrode and the inversion layer 321b of the non-selected unit cell 412. Accordingly, the non-selected unit cell 412 may not be programmed.

A program operation of the other non-selected unit cells that do not share any word lines and any bit lines with the selected unit cell 423 may also be prohibited by the same mechanism as described above.

Figure 12:
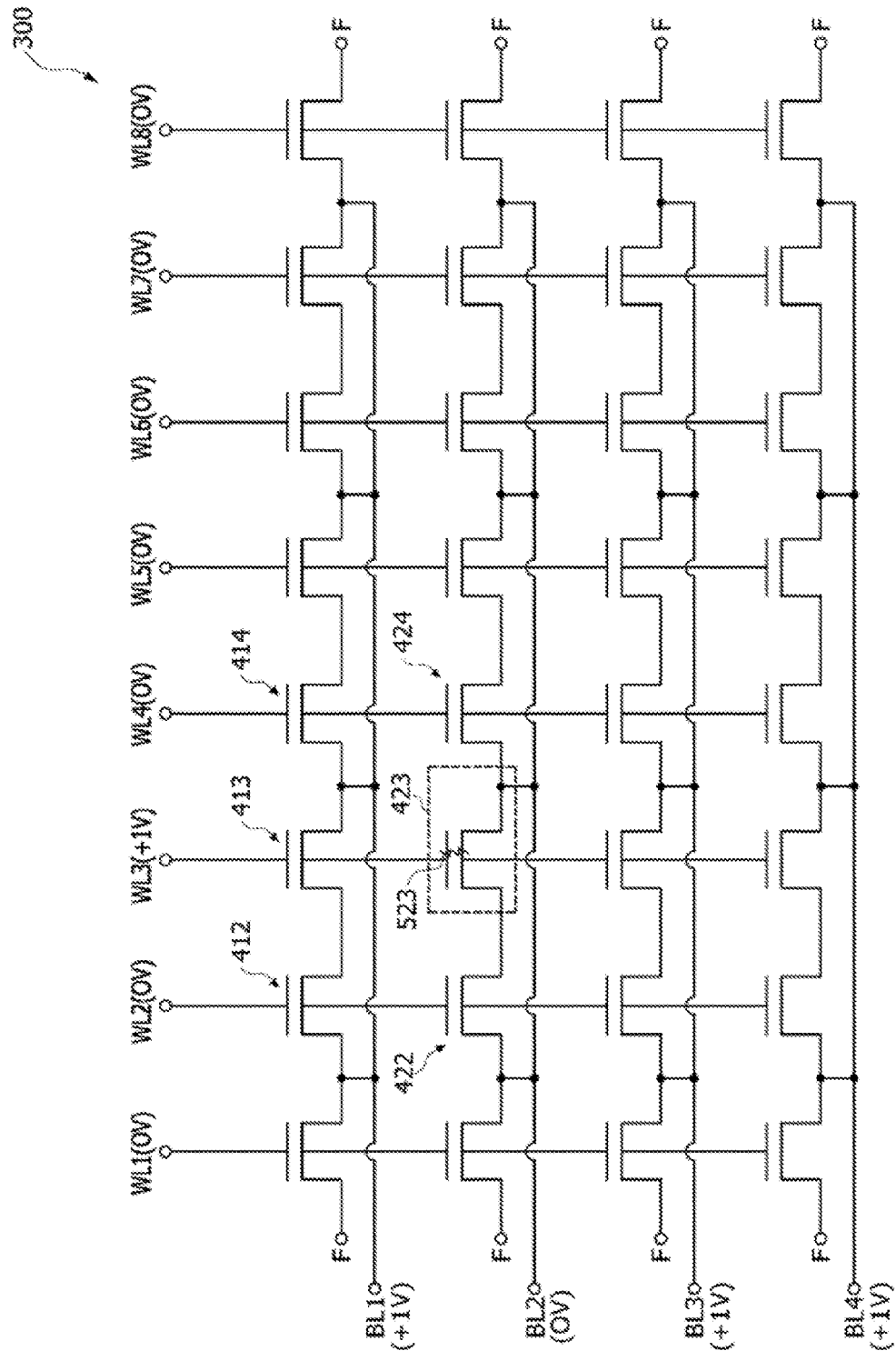
FIG. 12 is an equivalent circuit diagram illustrating a method of reading the anti-fuse type NVM cell array shown in FIG. 5.

FIG. 12 is an equivalent circuit diagram illustrating a read operation of the anti-fuse type NVM cell array 300 shown in FIG. 5. The read operation of the anti-fuse type NVM cell array 300 will be described in conjunction with an example in which a datum stored in the unit cell 423 located at a cross point of the second row and the third column is selectively read out. In particular, it is presumed that the selected unit cell 423 has a programmed state to include a resistive path 523 therein.

As illustrated in FIG. 12, to read the selected unit cell 423, a positive read voltage for example, +1 volt may be applied to the third word line WL3 connected to the selected unit cell 423 and a ground voltage may be applied to the remaining word lines WL1, WL2 and WL4 to WL8 while the P-type well region 310 is grounded. The positive read voltage may be higher than a threshold voltage of the selected unit cell 423. In addition, a ground voltage may be applied to the second bit line BL2 connected to the selected unit cell 423, and a positive bit line voltage for example, +1 volt may be applied to the remaining bit lines BL1, BL3 and BL4. The positive bit line voltage may be equal to the positive read voltage.

Under the above read bias condition, a current path may be formed between the third word line WL3 and the second bit line BL2 connected to the selected unit cell 423 due to the presence of the resistive path 523. That is, since a voltage difference of 1 volt is created between the third word line WL3 and the second bit line BL2, a current may flow from the third word line WL3 towards the second bit line BL2. In such a case, the selected unit cell 423 may be regarded as being programmed by sensing the current flowing through the resistive path 523 and the second bit line BL2.

While reading the selected unit cell 423, data stored m non-selected unit cells may not be read out regardless of whether or not the non-selected unit cells are programmed. For example, while a datum stored in the selected unit cell 423 is read out, read operations of non-selected unit cells such as, the unit cells 413 located at a cross point of the first row and the third column, sharing the third word line WL3 with the selected unit cell 423, non-selected unit cells such as, the unit cell 422 located at a cross point of the second row and the second column as well as the unit cell 424 located at a cross point of the second row and the fourth column, sharing the second bit line BL2 with the selected unit cell 423, and non-selected unit cells such as, the unit cell 412 located at a cross point of the first row and the second column, not sharing any word lines and any bit lines with the with the selected unit cell 423 may be prohibited.

Figure 13:
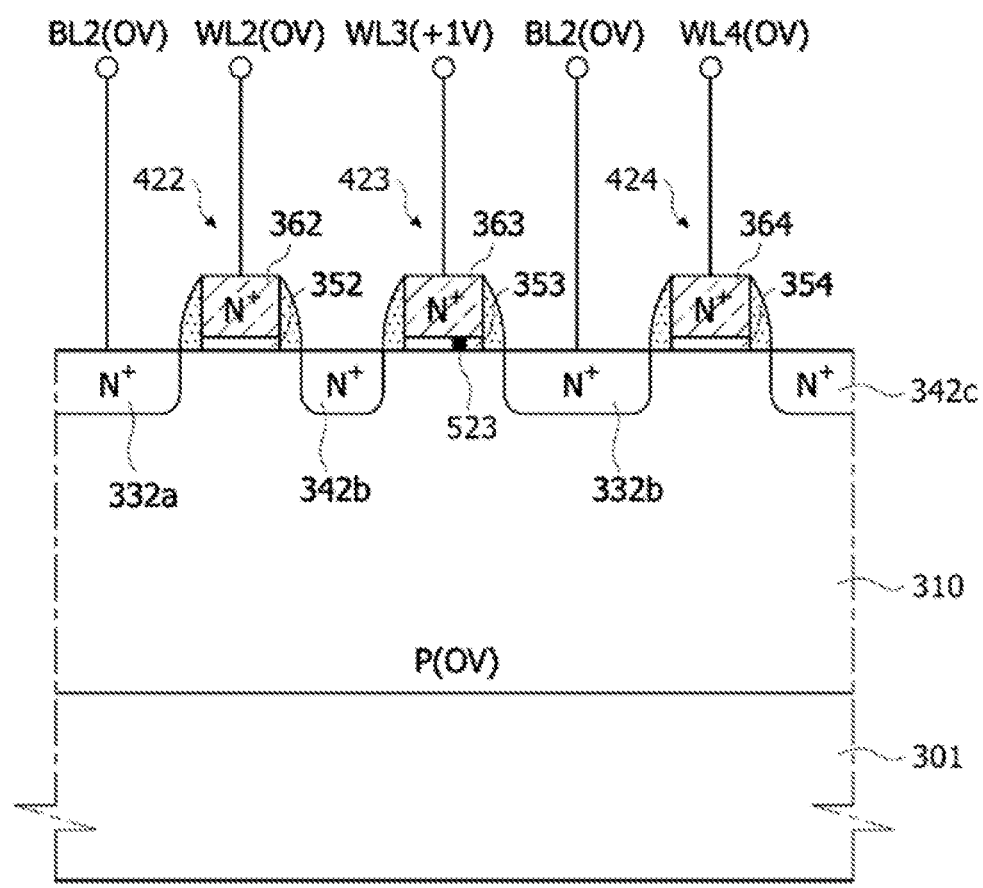
FIG. 13 is a cross-sectional view illustrating a read operation of a selected memory cell in the anti-fuse type NVM cell array shown in FIG. 12 and a read inhibition operation of a non-selected memory cell sharing a bit line with the selected memory cell of FIG. 12.

FIG. 13 is a cross-sectional view illustrating a read operation of the selected memory cell 423 in the anti-fuse type NVM cell array 300 shown in FIG. 12 and a read inhibition operation of the non-selected memory cells 422 and 424 sharing the second bit line BL2 with the selected memory cell 423 of FIG. 12.

Referring to FIG. 13, since the positive read voltage for example, +1 volt is applied to the third word line WL3, the inversion layer 322c may be formed in the channel region of the selected memory cell 423. In such a case, a ground voltage applied to the second bit line BL2 may be transmitted to the inversion layer 322c through the first N-type junction region 332b. Thus, a voltage difference of 1 volt may be created across the anti-fuse insulation pattern 353 between the gate electrode 363 and the inversion layer 322c of the selected unit cell 423. This voltage difference of 1 volt may generate a current flowing from the third word line WL3 towards the second bit line BL2 through the gate electrode 363, the resistive path 523, the inversion layer 322c and the first N-type junction region 332b.

Since a ground voltage is applied to the second word line WL2, no inversion layer may be formed in the channel region of the non-selected unit cell 422, which is located at a cross point of the second row and the second column, and shares the second bit line BL2 with the selected unit cell 423. Thus, the gate electrode 362 of the non-selected unit cell 422 may be electrically insulated from the first N-type junction region 332a corresponding to a drain region of the non-selected unit cell 422. Even though the non-selected unit cell 422 has a programmed state to include a resistive path in the anti-fuse insulation pattern thereof, no current may flow from the second word line WL2 towards the second bit line BL2 since both the second word line WL2 and the second bit line BL2 are grounded. Accordingly, the read operation of the selected unit cell 423 may not be affected by the non-selected unit cell 422.

In addition, since a ground voltage is applied to the fourth word line WL4, no inversion layer may be formed in the channel region of the non-selected unit cell 424, which is located at a cross point of the second row and the fourth column, and shares the second bit line BL2 with the selected unit cell 423. Thus, the gate electrode 364 of the non-selected unit cell 424 may be electrically insulated from the first N-type junction region 332b corresponding to a drain region of the non-selected unit cell 424. Even though the non-selected unit cell 424 has a programmed state which includes a resistive path in the anti-fuse insulation pattern thereof, no current may flow from the fourth word line WL4 towards the second bit line BL2 since both of the fourth word line WL4 and the second bit line BL2 are grounded. Accordingly, the read operation of the selected unit cell 423 may not be affected by the non-selected unit cell 424. Moreover, while the read operation of the selected unit cell 423 is performed, data stored in the other non-selected unit cells sharing the second bit line BL2 with the selected unit cell 423 may not be read out by the same mechanism as described above.

Figure 14:
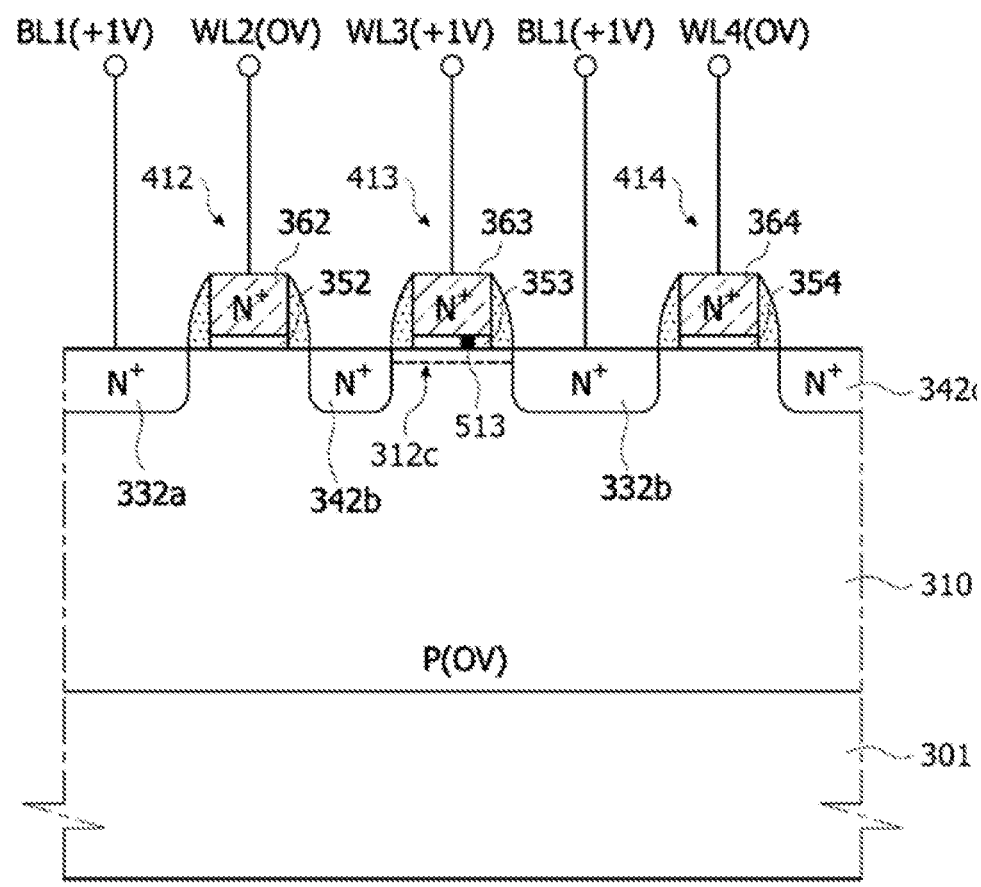
FIG. 14 is a cross-sectional view illustrating a read inhibition operation of a non-selected memory cell sharing a word line with a selected memory cell of the anti-fuse type NVM cell array shown in FIG. 12.

FIG. 14 is a cross-sectional view illustrating a read inhibition mechanism of the non-selected memory cell 413 sharing the third word line WL3 with the selected memory cell 423 of the anti-fuse type NVM cell array 300 shown in FIG. 12 and a read inhibition mechanism of the non-selected memory cells 412 and 414 that do not share any word lines and any bit lines with the selected memory cell 423 of FIG. 12.

Referring to FIG. 14, since the positive read voltage for example, +1 volt is applied to the third word line WL3, an inversion layer 312c may be formed in the channel region of the non-selected memory cell 413 sharing the third word line WL3 with the selected memory cell 423. In such a case, the positive bit line voltage for example, +1 volt, applied to the first bit line BL1 may be transmitted to the inversion layer 312c through the first N-type junction region 332b. Thus, even though the non-selected unit cell 413 has a programmed state to include a resistive path 513 in the anti-fuse insulation pattern thereof, no current may flow from the third word line WL3 towards the first bit line BL1 since no voltage difference is created between the third word line WL3 and the first bit line BL1. Accordingly, the non-selected unit cell 413 may not affect the read operation of the selected unit cell 423.

Since a ground voltage is applied to the second word line WL2, no inversion layer may be formed in a channel region of the non-selected memory cell 412, which is located at a cross point of the first row and the second column, and shares the first bit line BL1 with the non-selected unit cell 413. In addition, since the P-type well region 310 is grounded and the positive bit line voltage for example, +1 volt is applied to the first N-type junction region 332a, a reverse bias may be applied between the P-type well region 310 and the first N-type junction region 332a. Thus no current may flow through the non-selected unit cell 412 even though the non-selected unit cell 412 has a programmed state to include a resistive path in the anti-fuse insulation pattern 352 thereof.

Since a ground voltage is applied to the fourth word line WL4, no inversion layer may be formed in a channel region of the non-selected memory cell 414, which is located at a cross point of the first row and the fourth column, and shares the first bit line BL1 with the non-selected unit cell 413. In addition, since the P-type well region 310 is grounded and the positive bit line voltage for example, +1 volt) is applied to the first N-type junction region 332b, a reverse bias may be applied between the P-type well region 310 and the first N-type junction region 332b. Thus, no current may flow through the non-selected unit cell 414 even though the non-selected unit cell 414 has a programmed state to include a resistive path in the anti-fuse insulation pattern 354 thereof.

As described above, if a read operation of a selected unit cell is performed, a datum stored in the selected unit cell may be read out by sensing a current flowing through a word line and a bit line connected to the selected unit cell. In such a case, non-selected unit cells may not affect the read operation of the selected unit cell regardless of whether or not the non-selected unit cells are programmed. That is, while the read operation of the selected unit cell is performed, no sneak current path may be generated in the non-selected unit cells to prevent malfunction of an anti-fuse type NVM cell array.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. An anti-fuse type nonvolatile memory (NVM) cell comprising:
   a semiconductor layer having a first conductivity type;
   a junction region having a second conductivity type and a trench isolation layer disposed in an upper portion of the semiconductor layer spaced apart from each other by a channel region;
   an anti-fuse insulation pattern disposed on the channel region;
   a gate electrode disposed on the anti-fuse insulation pattern, the gate electrode being comprised of a poly-silicon material doped with impurities having the second conductivity type;
   a gate spacer disposed on sidewalls of the anti-fuse insulation pattern and the gate electrode;
   a word line connected to the gate electrode; and
   a bit line connected to the junction region,
   wherein the anti-fuse insulation pattern is broken when a first bias voltage and a second bias voltage are applied to the word line and the bit line, respectively, and the gate electrode, the semiconductor layer and the junction region constitute a bipolar junction transistor when the anti-fuse insulation pattern is broken.

2. The anti-fuse type NVM cell of claim 1, wherein the first conductivity type is P-type and the second conductivity type is N-type.

3. The anti-fuse type NVM cell of claim 1, wherein the gate electrode is spaced apart from the junction region in a horizontal direction by a lower width of the gate spacer adjacent to a surface of the channel region.

4. The anti-fuse type NVM cell of claim 3, wherein the gate electrode extends onto the trench isolation layer.

5. The anti-fuse type NVM cell of claim 3, wherein the junction region is aligned with an outer sidewall of the gate spacer disposed on a sidewall of the gate electrode adjacent to the junction region.

6. The anti-fuse type NVM cell of claim 1, further comprising a metal silicide layer disposed on the junction region.

7. The anti-fuse type NVM cell of claim 1,
wherein the first bias voltage applied to the word line is higher than a threshold voltage for forming an inversion layer in the channel region and a breakdown voltage for breaking the anti-fuse insulation pattern, and
wherein the second bias voltage applied to the bit line is a ground voltage.

* * * * *